United States Patent
Shany et al.

(10) Patent No.: US 9,985,653 B2
(45) Date of Patent: May 29, 2018

(54) METHODS AND SYSTEMS FOR SOFT-DECISION DECODING

(71) Applicant: Samsung Electronics Co., Ltd., Suwon-si, Gyeonggi-do (KR)

(72) Inventors: Yaron Shany, Ramat Gan (IL); Jun Jin Kong, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 143 days.

(21) Appl. No.: 14/683,656

(22) Filed: Apr. 10, 2015

(65) Prior Publication Data

US 2016/0301429 A1    Oct. 13, 2016

(51) Int. Cl.
| | |
|---|---|
| *H03M 13/15* | (2006.01) |
| *G06F 11/10* | (2006.01) |
| *H03M 13/37* | (2006.01) |
| *H03M 13/45* | (2006.01) |

(52) U.S. Cl.
CPC ....... *H03M 13/152* (2013.01); *G06F 11/1068* (2013.01); *H03M 13/1515* (2013.01); *H03M 13/1525* (2013.01); *H03M 13/3707* (2013.01); *H03M 13/451* (2013.01); *H03M 13/153* (2013.01)

(58) Field of Classification Search
CPC .................................................. G06F 11/1076
USPC ................................. 714/764, 792, 758, 755
See application file for complete search history.

(56) References Cited

U.S. PATENT DOCUMENTS

| | | | |
|---|---|---|---|
| 6,381,726 | B1 | 4/2002 | Weng |
| 6,634,007 | B1 * | 10/2003 | Koetter ............... H03M 13/132 |
| | | | 714/782 |
| 7,480,342 | B2 | 1/2009 | Wilhelmsson et al. |
| 7,694,206 | B2 | 4/2010 | Sawada |
| 8,019,079 | B2 | 9/2011 | Delgosha et al. |
| 8,145,981 | B2 | 3/2012 | Mokhlesi et al. |
| 8,332,728 | B2 | 12/2012 | Cheng et al. |
| 8,413,021 | B2 | 4/2013 | Wang et al. |
| 8,499,217 | B2 | 7/2013 | Song et al. |

(Continued)

OTHER PUBLICATIONS

Ludo Tolhuizen, "Subfield Checking in BCH-decoding", Philips Research Laboratories, ISIT 1997, Ulm, Germany, Jun. 29-Jul. 4, pp. 2257-2265.

(Continued)

*Primary Examiner* — Fritz Alphonse
(74) *Attorney, Agent, or Firm* — Harness, Dickey & Pierce, P.L.C.

(57) ABSTRACT

At least one example embodiment discloses a method of soft-decision Wu decoding a code. The code is one of a generalized Reed-Solomon type and an alternant type. The method includes obtaining a module of the code. The module is a sub-module of at least a first extension module and a second extension module. The first extension module is defined by a set of first type constraints and the second extension module is defined by a set of second type constraints. The first type constraints are applicable to a first interpolation algorithm and a second interpolation algorithm and the second type constraints are applicable to the first interpolation algorithm. The method further includes determining a basis for the first extension module and converting the basis for the first extension module to a basis for the module.

7 Claims, 10 Drawing Sheets

(56) References Cited

U.S. PATENT DOCUMENTS

| | | | |
|---|---|---|---|
| 8,516,347 B1 | 8/2013 | Li et al. | |
| 8,559,540 B2* | 10/2013 | Sun | H03M 13/3905 375/265 |
| 8,607,128 B2 | 12/2013 | Weingarten et al. | |
| 8,650,457 B1 | 2/2014 | Yeo | |
| 8,674,860 B2 | 3/2014 | Wu | |
| 9,411,679 B2* | 8/2016 | Seol | G06F 11/1008 |
| 2003/0212945 A1* | 11/2003 | Sundaram | H03M 13/15 714/781 |
| 2010/0165730 A1* | 7/2010 | Sommer | G06F 11/1068 365/185.03 |
| 2010/0251076 A1 | 9/2010 | Wu et al. | |
| 2013/0117640 A1 | 5/2013 | Tai et al. | |
| 2013/0198705 A1* | 8/2013 | Janssen | G06F 17/504 716/111 |
| 2013/0318422 A1 | 11/2013 | Weathers et al. | |
| 2014/0006896 A1 | 1/2014 | Wu | |
| 2014/0015697 A1* | 1/2014 | Wu | H03M 13/1515 341/52 |

OTHER PUBLICATIONS

Yingquan Wu, "New List Decoding Algorithms for Reed-Solomon and BCH Codes", Link_A_Media Devices Corp. Dec. 10, 2008, pp. 1-44.

Peter Trifonov et al., "Efficient Interpolation in Wu List Decoding Algorithm", IEEE Transactions on Information Theory, vol. 58, No. 9, Sep. 2012, pp. 1-9.

Peter Trifonov, "Another Derivation of Wu List Decoding Algorithm and Interpolation in Rational Curve Fitting", Saint-Peterbsurg State Polytechnic University, pp. 6.

R.J. McEliece, "The Guruswami-Sudan Decoding Algorithm for Reed-Solomon Codes", IPN Progress Report 42-153, May 15, 2003, pp. 1-60.

Mostafa H. Mohamed et al., "Reduced List-Decoding of Reed-Solomon Codes Using Reliability Information", Institute of Communications Engineering, Ulm University, Ulm 89081, Germany, pp. 8.

Kwankyu Lee et al., "List Decoding of Reed-Solomon Codes from a Gröbner Basis Perspective", School of Computational Sciences, Feb. 2, 2008, pp. 1-17.

Kwankyu Lee et al., "An Interpolation Algorithm using Gröbner Bases for Soft-Decision Decoding of Reed-Solomon Codes", ISIT 2006,Seattle, USA Jul. 9-14, 2006, pp. 2032-2036.

Ralf Koetter et al., "The Re-Encoding Transformation in Algebraic List-Decoding of Reed-Solomon Codes", IEEE Transactions on Information Theory, Apr. 2010, pp. 1-15.

Pascal Giorgi et al., "On the Complexity of Polynomial Matrix Computations", CNRS, INRIA, Laboratoire LIP, ISSAC '03, Aug. 3-6, 2003, Philadelphia, Pennsylvania, pp. 1-8.

Patrick Fitzpatrick, "On the Key Equation", IEEE Transactions on Information Theory, vol. 41, No. 5, Sep. 1995, pp. 1290-1302.

Peter Beelen et al., "On Rational Interpolation-Based List-Decoding and List-Decoding Binary Goppa Codes", IEEE Transactions on Information Theory, vol. 59, No. 6, Jun. 2013, pp. 3269-3281.

Michael Alekhnovich, "Liinear Diophantine Equations Over Polynomials and Soft Decoding of Reed-Solomon Codes", IEEE Transactions on Information Theory, vol. 51, No. 7, Jul. 2005, pp. 9.

* cited by examiner

METHODS AND SYSTEMS FOR SOFT-DECISION DECODING

BACKGROUND

Many types of systems support hard decision (HD) decodings and soft-decision (SD) decodings.

For example, a nonvolatile memory device includes a plurality of memory cells that store data in a nonvolatile manner. An example of the nonvolatile memory device is a flash memory device. Some flash memory applications support HD decodings and SD decodings.

When HD decoding fails, an SD decoding algorithm may be used to increase the probability of correctly decoding a codeword. One type of SD is algebraic SD decoding.

SUMMARY

At least one example embodiment discloses a method of soft-decision Wu decoding a code with the code being one of a generalized Reed-Solomon type and an alternant type. The method includes obtaining the code, the code having at least one property defining at least one module, the module being a sub-module of at least a first extension module and a second extension module, the first extension module being defined by a set of first type constraints and the second extension module being defined by a set of second type constraints, the first type constraints being applicable to a first interpolation algorithm and a second interpolation algorithm and the second type constraints being applicable to the first interpolation algorithm, determining a Groebner basis for the first extension module and converting the Groebner basis for the first extension module to a basis for the module.

In an example embodiment, the converting converts the Groebner basis for the first extension module to a Groebner basis for the module.

In an example embodiment, the converting includes applying a number of iterations of Koetter's algorithm to the Groebner basis for the first extension module.

In an example embodiment, the code is a binary BCH code.

In an example embodiment, the code is a Reed-Solomon code.

In an example embodiment, the obtaining obtains the code from a three-dimensional memory array.

In an example embodiment, the three dimensional memory array comprises a plurality of memory cells, each of the memory cells including a charge trap layer.

In an example embodiment, at least one of word lines and bit lines in the three-dimensional memory array are shared between levels.

At least one example embodiment discloses a method of soft-decision Wu decoding a code with the code being one of a generalized Reed-Solomon type and an alternant type. The method includes obtaining the code, the code having at least one property defining at least one module, the module being a sub-module of at least a first extension module and a second extension module, the first extension module being defined by a set of first type constraints and the second extension module being defined by a set of second type constraints, determining a triangular basis for the first extension module and determining a basis for the module based on the triangular basis for the first extension module.

In an example embodiment, the determining a basis for the module includes determining a triangular basis for the module based on the triangular basis for the first extension module. In an example embodiment, the triangular basis for the module is $$\{f_0 g_0, \ldots, f_l g_l\}$$

wherein $\{g_0, \ldots, g_l\}$ is the triangular basis for the first extension module and $$f_j(X) := \prod_{x \in B} (X - x)^{[m_x - 1 - (\ell - j)]_+}, \; j = 0, \ldots, \ell,$$

where B indicates the second type constraints, l is a list size and $m_x$ are entries of a vector of multiplicities.

In an example embodiment, the determining a basis for the module includes converting the triangular basis for the module to a Groebner basis for the module.

In an example embodiment, the code is a binary BCH code.

In an example embodiment, the code is a Reed-Solomon code.

In an example embodiment, the obtaining obtains the code from a three-dimensional memory array.

In an example embodiment, the three dimensional memory array comprises a plurality of memory cells, each of the memory cells including a charge trap layer.

In an example embodiment, at least one of word lines and bit lines in the three-dimensional memory array are shared between levels.

At least one example embodiment discloses a method of soft-decision Wu decoding a code, the code being one of a generalized Reed-Solomon type and an alternant type. The method includes obtaining the code, the code having at least one property defining at least one module, the module being a sub-module of at least a first extension module and a second extension module, the first extension module being defined by a set of first type constraints and the second extension module being defined by a set of second type constraints, determining whether a total cost associated with the set of second type constraints is above the threshold and determining one of a Groebner basis for the first extension module, a Groebner basis for the module using Koetter's algorithm and a triangular basis for the first extension module based on whether the total cost associated with the set of second type constraints is above the threshold.

In an example embodiment, if the total cost associated with the set of second type constraints is below the threshold, the determining one of a Groebner basis for the first extension module, a Groebner basis for the module, and a triangular basis for the first extension module determines the Groebner basis for the first extension module. The method further includes converting the Groebner basis for the first extension module to a Groebner basis for the module by applying a number of iterations of Koetter's algorithm to the Groebner basis for the first extension module.

In an example embodiment, if the total cost associated with the set of second type constraints is above the threshold, the determining one of a Groebner basis for the first extension module, a Groebner basis for the module, and a triangular basis for the first extension module determines the triangular basis for the first extension module. The method further includes determining a triangular basis for the module based on the triangular basis for the first extension module and converting the triangular basis for the module to the Groebner basis for the module.

In an example embodiment, if the total cost associated with the set of second type constraints is above the threshold, the determining one of a Groebner basis for the first extension module, a Groebner basis for the module, and a triangular basis for the first extension module determines a Groebner basis for the module using Koetter's algorithm. The method further includes performing the following:

$$\text{for } j=0 \text{ to } l, g_j = Y^j \cdot \Pi_{x \in B}(X-x)^{[m_x-(l-j)]_+},$$

where X is a first intermediate, Y is a second intermediate, $g_j$ is an initial value for the Groebner basis, B indicates the second type constraints, l is a list size and $m_x$ are entries of a vector of multiplicities.

BRIEF DESCRIPTION OF THE DRAWINGS

Example embodiments will become more appreciable through the description of the drawings in which.

DETAILED DESCRIPTION

Figure 1:
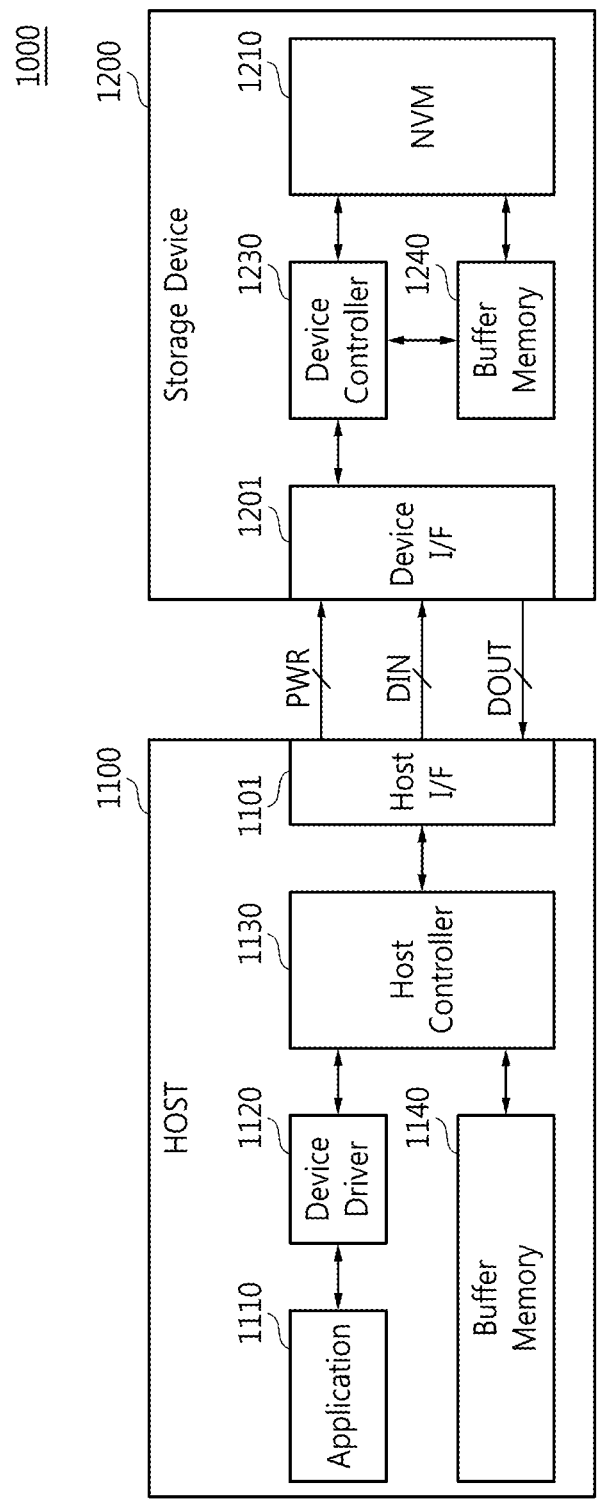
FIG. 1 is a block diagram illustrating a storage system according to an example embodiment.

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

FIG. 1 is a block diagram schematically illustrating a storage system according to an example embodiment.

While example embodiments of FIGS. 1-4C are described in the context of a non-volatile storage system, it should be understood that the decoding described herein may be implemented in various other technologies such as wireless communications, wired (cable-based) communications, satellite communications and storage devices other than non-volatile memories (e.g., RAM).

Referring to FIG. 1, the storage system 1000 includes a host 1100 and a storage device 1200.

The host 1100 includes a host interface 1101, and the storage device includes a device interface 1201. The storage device 1200 and the host 1100 are connected to one another through the interfaces 1101 and 1201. The host interface 1101 and the device interface 1201 may be standardized interfaces such as a UFS (Universal Flash Storage) interface, a SATA (serial advanced technology attachment (ATA)) interface, a SCSI (Small Computer Small Interface), a SAS (serial attached SCSI), etc. The host interface 1101 and the device interface 1201 are connected by data lines DIN and DOUT for exchanging data and/or signals, and by power lines PWR for providing power. In the example shown in FIG. 1, the host interface 1101 provides power to the device interface 1201 via the power line PWR.

Still referring to FIG. 1, the host 1100 further includes a host controller 1130, a buffer memory 1140, an application 1110 and a device driver 1120.

According to at least some example embodiments, the application 1110 may refer to one or more application programs executed on the host 1100. The application 1110 and/or the device driver 1120 may be implemented by hardware, software and/or firmware. The host controller 1130 receives data from and sends commands (e.g., read, write, erase) and/or data to the storage device 1200 through the host interface 1101.

According to at least some example embodiments, the buffer memory 1140 may be used as a main memory and/or a cache memory of the host 1100. The buffer memory 1140 (e.g., synchronous random access memory (SRAM) and/or dynamic random access memory (DRAM)) may also be used as a driving memory to drive software such as the application 1110 and/or the device driver 1120.

Still referring to FIG. 1, the storage device 1200 further includes a nonvolatile memory 1210, a device controller (also referred to as a memory controller) 1230 and a buffer memory 1240. In this example, the storage device 1200 may be a data storage device based on a nonvolatile memory such as a flash memory or the like. For example, the nonvolatile memory 1210 may be a flash memory, a magnetic random access memory (MRAM), a phase change RAM (PRAM), a ferroelectric RAM (FeRAM), etc.

The non-volatile memory may be a two-dimensional (2D) or three dimensional (3D) memory array. A 3D memory array is monolithically formed in physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Patent Application Publication No. 2011/0233648.

The device controller 1230 controls an overall operation of the nonvolatile memory 1210 including, for example, write operations, read operations, erase operations, encoding/decoding, error correction, etc. The device controller 1230 exchanges data with the nonvolatile memory 1210 and/or the buffer memory 1240 through an address and/or data bus. The device controller 1230 will be discussed in more detail later.

The buffer memory 1240 (e.g., synchronous random access memory (SRAM) and/or dynamic random access memory (DRAM)) temporarily stores data to be stored in the nonvolatile memory 1210 and/or data read from the nonvolatile memory 1210. The buffer memory 1240 may be implemented by a volatile and/or nonvolatile memory.

Figure 2:
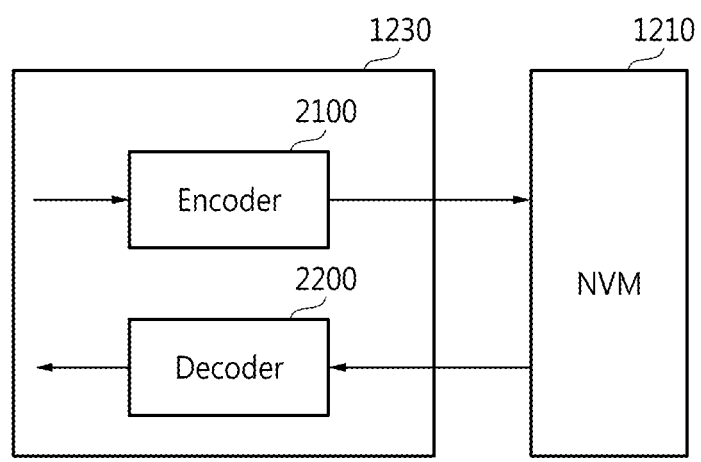
FIG. 2 is a block diagram illustrating an example embodiment of a device controller shown in FIG. 1.

FIG. 2 is a block diagram illustrating an example embodiment of the device controller 1230 shown in FIG. 1.

The device controller 1230 may be hardware, firmware, hardware executing software or any combination thereof. When the device controller 1230 is hardware, such hardware may include one or more Central Processing Units (CPUs), digital signal processors (DSPs), application-specific-integrated-circuits (ASICs), field programmable gate arrays (FPGAs) computers or the like configured as a special purpose machines to perform the functions of the device controller 1230. CPUs, DSPs, ASICs and FPGAs may generally be referred to as processors and/or microprocessors.

In the event that the device controller 1230 is a processor executing software, the processor is configured as special purpose machine to execute the software to perform the functions of the device controller 1230. In such an embodiment, the device controller 1230 may include one or more Central Processing Units (CPUs), digital signal processors (DSPs), application-specific-integrated-circuits (ASICs), field programmable gate arrays (FPGAs) computers.

Referring to FIG. 2, the device controller 1230 includes an encoder 2100 (also referred to herein as an encoding circuit or encoder circuit) and a decoder 2200 (also referred to herein as a decoding circuit or decoder circuit).

Similar to the device controller 1230, the encoder 2100 (including one or more components thereof) may be hardware, firmware, hardware executing software or any combination thereof. When the encoder 2100 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the encoder 2100. CPUs, DSPs, ASICs and FPGAs may generally be referred to as processors and/or microprocessors.

In the event that the encoder 2100 is a processor executing software, the processor is configured as a special purpose machine to execute the software to perform the functions of the encoder 2100. In such an embodiment, the encoder 2100 may include one or more Central Processing Units (CPUs), digital signal processors (DSPs), application-specific-integrated-circuits (ASICs), field programmable gate arrays (FPGAs) computers.

The encoder 2100 performs encoding on input data words (also referred to herein as an input data sequence or input data) received from the host 1100 via the device interface 1201 and/or the buffer memory 1240. The encoder 2100 outputs the encoded data to the nonvolatile memory 1210. The nonvolatile memory 1210 stores the encoded data from the encoder 2100.

The decoder 2200 (including one or more components thereof) may be hardware, firmware, hardware executing software or any combination thereof. When the decoder 2200 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the decoder 2200. CPUs, DSPs, ASICs and FPGAs may generally be referred to as processors and/or microprocessors.

In the event that the decoder 2200 is a processor executing software, the processor is configured as a special purpose machine to execute the software to perform the functions of the decoder 2200. In such an embodiment, the decoder 2200 may include one or more Central Processing Units (CPUs), digital signal processors (DSPs), application-specific-integrated-circuits (ASICs), field programmable gate arrays (FPGAs) computers.

According to at least one example embodiment, the decoder 2200 reads data from the nonvolatile memory 1210 and decodes the read data. The decoder 2200 then outputs the decoded data to at least one of the buffer memory 1240 and the device interface 1201.

More specifically, the decoder 2200 is configured to perform soft Wu decoding of generalized Reed-Solomon codes and alternant codes (including Reed-Solomon and BCH codes).

Wu's algorithm is described in Y. Wu, "New list decoding algorithms for Reed-Solomon and BCH codes," IEEE Trans. Inform. Theory, vol. 54, no. 8, pp. 3611-3630, August 2008 (Wu's paper), the entire contents of which are herein incorporated by reference. Moreover, variants of Wu's algorithm are described in P. Trifonov and M. H. Lee, "Efficient interpolation in the Wu list decoding algorithm," IEEE Trans. Inform. Theory, vol. 58, no. 9, pp. 5963-5971, September 2012 ("Trifonov and Lee"), and P. Beelen, T. Hoeholdt, J. S. R. Nielsen, and Y. Wu, "On rational interpolation-based list-decoding and list-decoding binary Goppa codes," IEEE Trans. Inform. Theory, vol. 59, no. 6, pp. 3269-3281, June 2013 ("Beelen et al."), the entire contents of each of which are hereby incorporated by reference.

Example functionality of the decoder 2200 and its components will now be described in more detail with regard to FIGS. 3-4C.

Figure 3:
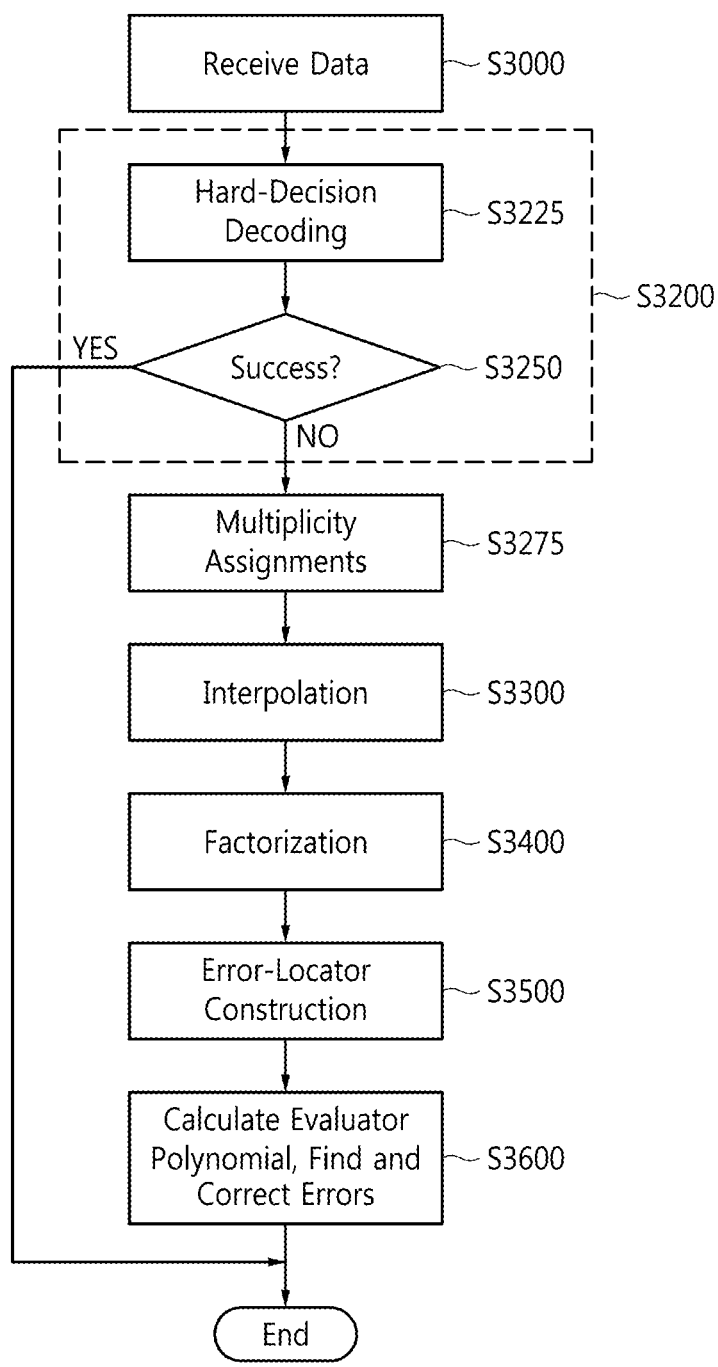
FIG. 3 is a flow chart illustrating an example embodiment of a method for decoding data read from a nonvolatile memory.

FIG. 3 is a flow chart illustrating an example embodiment of a method for decoding data read from the nonvolatile memory 1210. The decoder 2200 performs the steps in FIG. 3.

FIG. 3 is a method of soft Wu decoding of generalized Reed-Solomon codes and alternant codes according to an example embodiment.

At S3000, the decoder receives data from the nonvolatile memory 1210. In flash memories, the first read operation provides hard-decision data, and additional reads provide increasingly refined soft-decision information. Because the read operation is relatively slow, at the first step, only a single read, providing hard-decision information, is performed. So, at the first step, the output of block S3000 is a vector of bits, each bit being a hard-decision value for the relevant coordinate.

At S3200, the decoder performs hard-decision decoding at S3225 and determines whether the hard-decision decoding is considered successful at S3250.

The decoder may apply a known hard-decision decoding algorithm such as the Berlekamp-Massey algorithm, any known variant of the Berlekamp-Massey algorithm or a known variant of the Sugiyama algorithm. The output of the hard-decision decoding, at S3200, consists of two polynomials, which may be referred to as $\Lambda(X)$ and $B_+(X)$, possibly one or two additional integers (weights, possibly zero or negative) used for consequent soft-decision decoding, and, possibly, a decoded word as is described in further detail.

The decoded word is output if the decoder decides that hard-decision decoding succeeded. If the decoder decides that hard-decision decoding failed, then the output includes only the two polynomials $\Lambda(X)$ and $B_+(X)$ and the weights. If the hard-decision decoding block performs the Berlekamp-Massey algorithm (as described in Wu's paper) or the Berlekamp algorithm for decoding binary BCH codes (as described in Wu's paper), then the output $\Lambda(X)$ is exactly the polynomial $\Lambda(X)$ defined in the Berlekamp-Massey/Berlekamp algorithms in Wu's paper, and the output $B_+(X)$ is either $XB(X)$ (for decoding Reed-Solomon codes) or $X^2B(X)$ (for decoding binary BCH codes), for the $B(X)$ defined in the Berlekamp-Massey/Berlekamp algorithms of Wu's paper.

In this case, if hard-decision decoding succeeds, then the output $\Lambda(X)$ is an error-locator polynomial, that is, error locations are the inverses of the roots of $\Lambda(X)$.

For both the Berlekamp and Berlekamp-Massey algorithms, $\Lambda(X)$ is a shortest possible solution to the key equation $$\tilde{\Omega}(X) = \tilde{\Lambda}(X)S(X) \bmod X^{2t},$$

where $\tilde{\Omega}(X)$ is an error-evaluator polynomial, as defined, e.g., in Eq. (3) of Wu's paper, $\tilde{\Lambda}(X)$ is the error-locator polynomial whose roots are the inverses of the error locations (as defined, e.g., in Eq. (2) of Wu's paper), $S(X)$ is a syndrome polynomial, as defined, e.g., on p. 3613 of Wu's paper, and t is the designed correction radius of the generalized Reed-Solomon or binary BCH or binary alternant code to be decoded.

In other words, an error-locator polynomial is a polynomial whose roots determine the error locations, that is, which coordinates of the hard vector are erroneous. When using a binary code (such as a binary BCH code), the decoder flips the erroneous bits in the specified locations. In case a non-binary code (such as a Reed-Solomon code) is used, the decoder also determines the values of the errors.

An error-evaluator polynomial is a polynomial which, together with the above error-locator polynomial, is used by the decoder to find the error values (using, e.g., Forney's algorithm as described in R. E. Blahut, *Algebraic Codes for Data Transmission*, Cambridge University Press, 2003, p. 196 (Theorem 7.4.2), the entire contents of which are hereby incorporated by reference).

Herein, "shortest" means that the output $\Lambda(X)$ minimizes $$L_\Lambda := \max\{\deg(\Lambda(X)), \deg(\Lambda(X)S(X) \bmod X^{2t}) + 1\}.$$

It should be understood that the key equation has many alternative forms, and each version may use somewhat modified definitions of the error-locator and error-evaluator polynomials. For example, the key equation in Beelen et al. uses an error-locator polynomial which has the error locators themselves (rather than their inverses) as its roots, and an accordingly modified error-evaluator polynomial.

It should be understood that example embodiments may be used for any version of the key-equation/error-locator polynomial/error-evaluator polynomial.

Alternatively to the Berlekamp-Massey algorithm, the decoder may use any algorithm for finding a Groebner basis with respect to an appropriate monomial ordering for the module of all solutions $(\tilde{\Omega}, \tilde{\Lambda})$ for the key equation, as explained, for example, in detail in Steps 1-3 of Algorithm 1 on p. 3276 of Beelen et al., and in Fitzpatrick's paper (P. Fitzpatrick, "On the key equation," IEEE Trans. Inform. Theory, vol. 41, no. 5, pp. 1290-1302, September 1995), the entire contents of which are hereby incorporated by reference. In the case of decoding generalized Reed-Solomon codes, Beelen et al. use the weighted-lex monomial ordering with X>Y and with a weight of +1 for X and a weight of 0 for Y, which is the $(1, \mu)$-term order defined on p. 3271 of Beelen et al., for $\mu=0$. In other cases, such as the case of decoding binary Goppa codes (a special case of alternant codes, just like binary BCH codes are a special case of alternant codes), as described in Beelen et al., a modified key equation is formulated for even and odd parts of the error-locator polynomial (Equation (10) in Beelen et al.). In these cases, hard-decision decoding at S3200 may find a Groebner basis for the solution module of the modified key equation, with respect to the weighted-lex monomial ordering with X>Y and with a weight of +1 for X and a weight of 1 for Y, which is the $(1, \mu)$-term order defined on p. 3271 of Beelen et al., for $\mu=1$.

It should be noted that other orderings may also be useful for decoding. For example, the weighted-lex ordering with Y>X and with a weight of +1 for X and a weight of −1 for Y is used in Fitzpatrick's paper.

Suppose that $h_1(X, Y) = h_{10}(X) + Yh_{11}(X)$, $h_2(X, Y) = h_{20}(X) + Yh_{21}(X)$ is a Groebner basis for which a leading monomial of $h_1(X, Y)$ appears in $h_{10}(X)$, and a leading monomial of $h_2(X, Y)$ appears in $Yh_{21}(X)$, and let $\Lambda(X) := h_{10}(X)^2 + Xh_{11}(X)^2$ and $B_+(X) := h_{20}(X)^2 + Xh_{21}(X)^2$.

The first subscript, i, in the single-variable polynomial $h_{i,j}(X)$ indicates to which bivariate polynomial $h_i(X, Y)$ it belongs, while the second subscript (j, which may be either 0 or 1) indicates whether $h_{i,j}(X)$ is (j=1) or is not (j=0) multiplied by Y in $h_i(X, Y)$. In short: $h_i(X, Y) = h_{i0}(X) + Yh_{i1}(X)$ for i=1, 2.

If there are up to t errors in the received hard-decision vector, then the error locator will be either $\Lambda(X)$ or $B_+(X)$ up to a non-zero scalar factor, as explained in Beelen et al. Note that for binary Goppa codes, the designed correction radius t is not the correction radius of the underlying generalized Reed-Solomon code, but takes a higher value of $\deg(g(X))$, where $g(X)$ is the Goppa polynomial, as explained, e.g., on pp. 3277-3278 of Beelen et al.

At S3200, the decoder finds the roots of the assumed error locator polynomial in a step called Chien search, and in case the decoded code is non-binary, also finds the error values. The decoder may find the error values using Forney's algorithm, for example.

Using the error locators (and the error values for the non-binary case), together with the input hard-decision vector, the decoder may produce a candidate hard-decision decoded word. The hard-decision decoder may then calculate a syndrome of the candidate hard-decision decoded word. If the syndrome is zero, then the decoder determines the hard-decision decoding is successful at S3250, and the candidate hard-decision decoded word is the output of the decoder 2200. It should be noted that in some cases, knowing whether the above syndrome is zero does not require an explicit calculation of the syndrome, or even to perform a Chien search. For example, in the decoding of Reed-Solomon codes, as well as in the decoding of primitive binary BCH codes with the Berlekamp-Massey or Berlekamp algorithm, the syndrome of the corrected word is zero if and only if the error locator has t distinct roots in the finite field used to construct the codes and the variable L of the algorithm equals t, as described in L. Tolhuizen, "Subfield checking in BCH decoding," Proc. ISIT 1997, Ulm, Germany, June 29-July 4, p. 263, the entire contents of which are hereby incorporated by reference.

In such a case, no soft-decision decoding is performed. If the syndrome is non-zero, then the decoder determines the hard-decision decoding failed. In this case, the hard-decision decoding block S3200 outputs the polynomials $\Lambda(X)$ and $B_+(X)$, as well as one or two weights. Specifically, for decoding binary Goppa codes as in Beelen et al., two weights $w_1$ and $w_2$ may be calculated according to Eqs. (12), (13) of Beelen et al.: In case the number of errors, $\epsilon$, is even, $w_1$ is the right-hand side of the first equation in (12) and $w_2$ is the right-hand side of the second equation in (12), while if $\epsilon$ is odd, $w_1$ is the right-hand side of the first equation in (13) and $w_2$ is the right-hand side of second equation in (12). Although the above weights depend also on the unknown number of errors, $\epsilon$, it will be explained ahead that the decoder only has to know the difference $w_1 - w_2$. Observing the above two equations of Beelen et al., it can be seen that the difference $w_1 - w_2$ depends only on $\epsilon \bmod 2 \in \{0, 1\}$ (only two possibilities), and not on $\epsilon$ itself. To distinguish between the two possibilities, the decoder may simply check two assumptions ($\epsilon \bmod 2 = 0$ and $\epsilon \bmod 2 = 1$). Alternatively, at the cost of losing a single information bit, an even subcode (only even-weight words) of the original Goppa code may be used by the decoder. In this case, $\epsilon \bmod 2$ is simply the parity of the received hard-decision word.

Alternatively, for decoding Reed-Solomon codes as in Wu's paper, where the Berlekamp-Massey algorithm is used in the hard-decision decoding block S3200, the single weight $w := L_\Lambda - L_{XB}$ may be calculated and delivered as an output of block S3200. As another alternative, for decoding binary BCH codes as in Wu's paper, where Berlekamp's algorithm is used in the hard-decision decoding at S3200, the single weight $w:=L_A-L_{X^2B}$ may be calculated by the decoder and delivered as an output of the hard-decision decoding at S3200.

At S3275, the decoder converts a soft output vector into a vector of natural numbers (multiplicities) $\{m_x\}_{x \in K^*}$ if hard-decision decoding fails at S3250 (here, K is a finite-field used to define the generalized Reed-Solomon or alternant code being decoded, and K* is its multiplicative subgroup). The decoder may use any known method for generating multiplicities. For example, as in Section V of Wu's paper, the vector of multiplicities can be obtained by rounding a scalar multiple of the vector of symbol-error probabilities (for decoding generalized Reed-Solomon codes) or a scalar multiple of the vector of bit-error probabilities (for decoding binary BCH and alternant codes). As another example, the decoder may assign some fixed predefined and/or selected multiplicity m to the L least reliable coordinates, as in the paper of Mohamed, Nielsen, and Bossert (M, H, Mohamed, J. S. R. Nielsen, and M. Bossert, "Reduced list decoding of Reed-Solomon codes using reliability information," arXiv:1406:0688v1), the entire contents of which are hereby incorporated by reference. Alternatively, the decoder may use the following method: If for some coordinate the symbol-error probability (for generalized Reed-Solomon codes), or the bit-error probability (for binary BCH codes and alternant codes) is above some threshold, then assign to the coordinate a multiplicity of m, where m is some pre-defined and/or selected number. Otherwise, the decoder assigns a multiplicity of 0. Alternatively, for binary BCH and alternant codes in NAND flash memories, if the result of reads for soft-decision information (reads beyond the first read) indicates a "weak zero" or a "weak one" for some coordinate, then the decoder assigns to this coordinate a pre-defined and/or selected multiplicity of m. Otherwise, the decoder assigns to this coordinate a multiplicity of 0.

If hard-decision decoding fails at S3200, at S3300, the decoder performs interpolation based on the outputs from the hard-decision decoding at S3200 ($\Lambda(X)$ and $B_+(X)$ and one or two additional integers (weights, possibly zero or negative) used for soft-decision decoding) and the multiplicities vector generated at S3275.

The decoder at S3300 finds a bivariate polynomial $Q(X, Y) \in K[X, Y]$, where K is a finite-field used to define the generalized Reed-Solomon or alternant code being decoded, with the following property: $Q(X, Y)$ is in a $K[X]$-submodule N of $K[X, Y]$ to be shortly defined, and $Q(X, Y)$ has a minimum $(r, w)$-weighted degree among the polynomial in N, where r is either 1 or 2.

Here, the $(r, w)$-weighted degree of a polynomial $f(X, Y)=\sum_{j=1}^r a_j X^{i_X(j)} Y^{i_Y(j)} \in K[X, Y]$ with all $a_j$ non-zero, with $i_X(j), i_Y(j)$ non-negative integers for all j, and where the pairs $(i_X(j), i_Y(j))$ are distinct over distinct choices of j, is defined as $\max_j(ri_X(j)+wi_Y(j))$.

In some papers, such as Trifonov and Lee and Beelen et al., the interpolation problem concerns a partially homogenized trivariate polynomial of homogeneous Y-Z degree l (for some l), $Q(X, Y, Z)=\sum_{i=0}^l Q_i(X)Y^i Z^{l-i} \in K[X, Y, Z]$, and minimization of a $(1, w_1, w_2)$-weighted degree in a certain $K[X]$-submodule N' of a module $\{\sum_{i=0}^l F_i(X)Y^i Z^{l-i}\}$ of partially homogenized trivariate polynomials of homogeneous Y-Z degree l.

Here, the $(1, w_1, w_2)$-weighted degree of a trivariate polynomial $Q(X, Y, Z)$ is the maximum over all monomials $X^i Y^j Z^k$ appearing in $Q(X, Y, Z)$ of $i+w_1 j+w_2 k$. However, as explained in Lemma 1 of Trifonov and Lee, a map $f(X, Y, Z) \mapsto \tilde{f}(X, Y):=f(X, Y, 1)$ is an isomorphism of $K[X]$-modules, ($\tilde{\cdot}$): $\{\sum_{i=0}^l F_i(X)Y^i Z^{l-i}\} \to \{\sum_{i=0}^l F_i(X)Y^i\}$ between the partially homogenized polynomials with a homogenous Y-Z-degree of l and the bivariate polynomials of Y-degree at most l with the following effect on the multiplicities: For a partially homogenized polynomial $f(X, Y, Z)=\sum_{i=0}^l F_i(X) Y^i Z^{l-i}$ and for $x_0, y_0, z_0 \in K$, the multiplicity of $f(X, Y, Z)$ at the point $(x_0, y_0, z_0)$ with either $y_0$ or $z_0$ non-zero, $\text{mult}(f, (x_0, y_0, z_0))$, equals either $\text{mult}(\tilde{f}, (x_0, y_0/z_0))$ when $z_0 \neq 0$, or $\text{mult}(\hat{f}, (x_0, y_0/z_0))$ when $y_0 \neq 0$, where $\hat{f}(X, Y)=\sum_{i=0}^l F_i(X)Y^{l-i}$ is the Y-reversed version of $\tilde{f}(X, Y)=\sum_{i=0}^l F_i(X)Y^i$.

It may be verified directly from the definition of the isomorphism ($\tilde{\cdot}$) that the image of the module N' discussed above (the module in which interpolation takes place in Beelen et al.) under this isomorphism is just the module N that will be described ahead. Moreover, since the $(1, w_1, w_2)$-weighted degree of a monomial of the form $X^i Y^j Z^{l-j}$ equals $i+(w_1-w_2)j+lw_2$, that is, equals the $(1, w_1-w_2)$-weighted degree of $X^i Y^j$ plus $lw_2$, for $f(X, Y, Z)$ as above, the $(1, w_1, w_2)$-weighted degree of $f(X, Y, Z)$ equals the $(1, w_1-w_2)$-weighted degree of $\tilde{f}(X, Y)$ plus the constant $lw_2$ which does not depend on $f(X, Y, Z)$. This means that if $\tilde{f}(X, Y)$ minimizes the $(1, w_1-w_2)$-weighted degree in the module N, the image of N' under the isomorphism ($\tilde{\cdot}$), then the pre-image f of $\tilde{f}$ minimizes the $(1, w_1, w_2)$-weighted degree in N'.

The above-mentioned trivariate interpolation problems are equivalent to the bivariate interpolation problems, that is, to finding a bivariate polynomial minimizing the $(1, w)$-weighted degree in the module N to be shortly defined, where the single weight w for the equivalent bivariate problem may be obtained by subtraction, as in $w=w_1-w_2$. For this reason, without loss of generality, example embodiments discuss the bivariate interpolation problem.

For a list size l, N is the module consisting of all polynomials $f(X, Y)$ of Y-degree at most l (that is, $f(X, Y)$ may be written as $f(X, Y)=\sum_{i=0}^l F_i(X)Y^i$) that satisfy the following multiplicity constraints:

For all $x \in K^*$ (where K* is the multiplicative subgroup of K, that is, $K^*:=K\setminus\{0\}$),
  if $B_+(x) \neq 0$, then the multiplicity of f at the point $$\left(x, -\frac{\Lambda(x)}{B_+(x)}\right)$$

(for the case of generalized Reed-Solomon codes, or the for the case of binary BCH codes in Wu's paper), or at the point $$\left(x, \sqrt{\frac{\Lambda(x)}{B_+(x)}}\right)$$

(for the case of binary Goppa codes as in Beelen et al.) is at least $m_{x^{-1}}$, (the $x^{-1}$-th entry of the multiplicity vector obtained from the multiplicity-assignment block S3005), or $m_x$, where $x^{-1}$ is used when the error-locator polynomial is defined to have the inverses of the error locators as its roots, while x is used if the error-locator polynomial is defined to have the error locators themselves as its roots.

Otherwise, if $B_+(x)=0$, then the multiplicity of the Y-reversed version of $f(X, Y)$ at the point $(x, 0)$ is at least $m_{x^{-1}}$ (or $m_x$, where the choice is as described above), where if $f(X, Y)=\sum_{i=0}^{l} F_i(X)Y^i$, then the Y-reversed version of $f(X, Y)$ is defined to be $\sum_{i=0}^{l} F_i(X) Y^{l-i}$.

The list size l is a maximum allowed degree of Y in any monomial for polynomials in the module N. The list size l is also an upper bound on the maximum possible list size at the output of the decoder.

For the sake of brevity and clarity, only the case where the above multiplicity is $m_{x^{-1}}$ is discussed.

In view of the above definition of the module N, a more general definition of the module N may be considered. The set of points $x \in K^*$ for which $m_{x^{-1}} > 0$ is partitioned into two disjoint subsets A and B, and we are given a function $u: A \to K$. A module $\overline{N}$ may then be defined as $$\overline{N} := N_A \cap N_B$$

where $N_A$ and $N_B$ are the following sub-modules of the module of all bivariate polynomials of Y-degree at most l: $N_A$ is the sub-module consisting of all bivariate polynomials $f(X, Y)$ with Y-degree at most l that satisfy the condition $$\forall x \in A, \text{mult}(f,(x,u(x))) \geq m_{x^{-1}},$$

and $N_B$ is the sub-module consisting of all bivariate polynomials $f(X, Y)$ with Y-degree at most l that satisfy the condition $$\forall x \in B, \text{mult}(Y^l f(X, Y^{-1}),(x,0)) \geq m_{x^{-1}}.$$

The module N is a special case of the last definition (that is, of the module $\overline{N}$), with the set A being the set of all points x for which $m_{x^{-1}} > 0$ and, in addition, $B_+(x) \neq 0$, and with the set B being all of the points x for which $m_{x^{-1}} > 0$ and, in addition, $B_+(x) = 0$, and with $$u(x) = -\frac{\Lambda(x)}{B_+(x)} \text{ or } u(x) = \sqrt{\frac{\Lambda(x)}{B_+(x)}},$$

as explained above.

The condition regarding type B can also be explained as follows: for all x of type B, the multiplicity of the Y-reversed version of $f(X, Y)$ at the point $(x,0)$ is at least the entry $m_{x^{-1}}$ corresponding to $x^{-1}$ in the multiplicity vector.

If the set B were empty, that is, if $\overline{N}=N_A$, then the above interpolation problem would be identical to that encountered in Koetter-Vardy decoding.

To solve the interpolation problem, that is, to determine a polynomial with the minimum weighted degree, the decoder typically determines a Groebner basis for the module $\overline{N}$ with respect to the $(1, w)$-weighted-lex ordering with either $Y > X$ or $X > Y$ (both options are valid), and then outputs the polynomial of minimum weighted degree in the Groebner basis. Note that any monomial ordering>that agrees with the $(1, w)$-weighted degree (that is, if $X^{i_1}Y^{j_1} \leq X^{i_2}Y^{j_2}$, then the weighted degree of $X^{i_1}Y^{j_1}$ is not above that of $X^{i_2}Y^{j_2}$) may be used. From this point on, "Groebner basis" will stand for a Groebner basis with respect to such a monomial ordering.

Conventional methods for finding Groebner bases for modules over $K[X]$ may be divided into two main types. The first type contains algorithms that are aimed to find Groebner bases for modules such as $N_A$, that is, for finding a Groebner basis for the interpolation problem in the context of Koetter-Vardy decoding, as described in R. Koetter and A. Vardy, "Algebraic soft-decision decoding of Reed-Solomon codes," IEEE Trans. Inform. Theory, vol. 49, no. 11, pp. 2809-2825, November 2003, the entire contents of which are hereby incorporated by reference. A prominent algorithm of this type is Koetter's algorithm, as described, e.g., in Sect. VII of R. J. McEliece, "The Guruswami-Sudan decoding algorithm for Reed-Solomon codes," IPN Progress Report, vol. 42-153, May 2003 ("McEliece"), the entire contents of which are hereby incorporated by reference.

For describing the second type of algorithms, note that the sub-module of $K[X, Y]$ consisting of all polynomials of Y-degree at most l is isomorphic as a $K[X]$-module to $K[X]^{l+1}$. Hence, the modules $N_A$, $N_B$ and $\overline{N}$ may be considered sub-modules of $K[X]^{l+1}$. The second type of algorithms convert an existing free-module basis of some sub-module M of $K[X]^{l+1}$ to a Groebner basis. Examples of such algorithms are the algorithm of Alekhnovich (M. Alekhnovich, "Linear diopantine equations over polynomials and soft decoding of Reed-Solomon codes," IEEE Trans. Inform. Theory, vol. 51, no. 7, July 2005) and the algorithm of Giorgi et al. (P. Giorgi, C. Jeannerod, and G. Villard, "On the complexity of polynomial matrix computations," in Proc. Int. Symp. Symbol. Algebr. Comput., 2003, pp. 135-142, ACM), the entire contents of each of which is hereby incorporated by reference.

In what follows, we will refer to the above described first and second types of algorithms for finding a Groebner basis as "algorithms of version 1" and "algorithms of version 2," respectively.

Figure 4A:
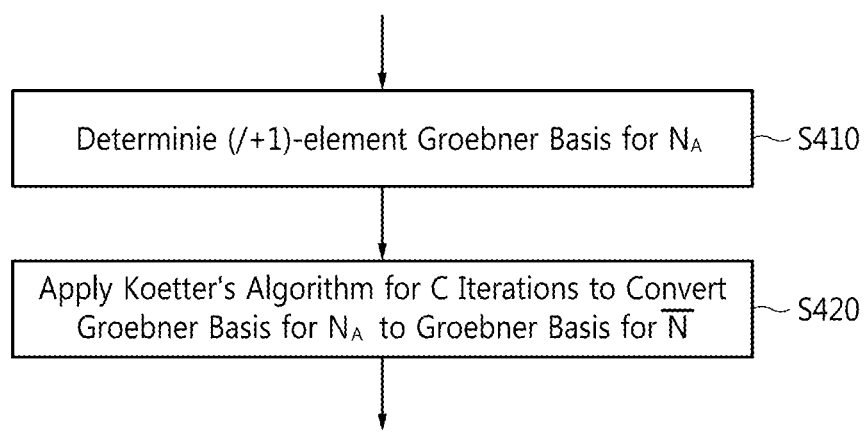
FIGS. 4A-4C illustrates example embodiments of determining a Groebner basis.
Figure 4B:
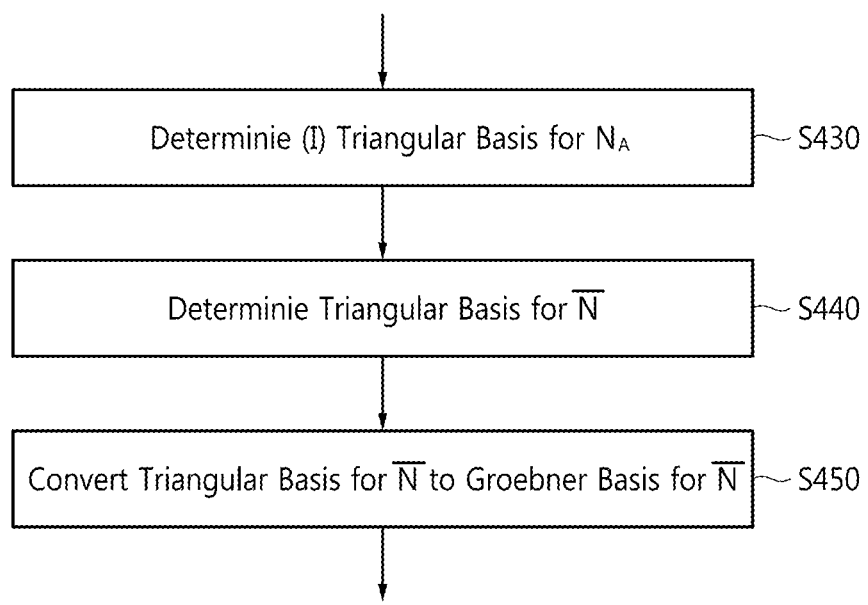
Figure 4C:
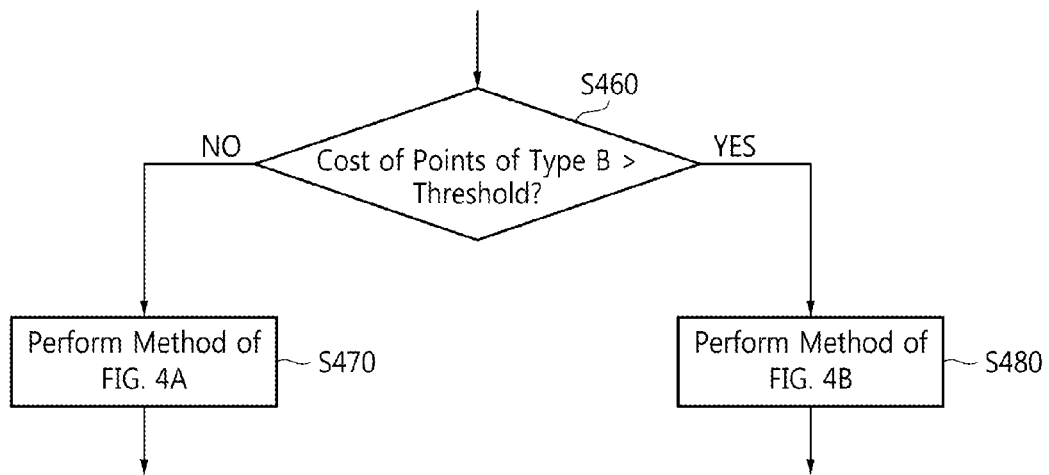

FIGS. 4A-4C illustrates example embodiments of determining a Groebner basis for the module $\overline{N}$.

Existing algorithms for interpolation in hard/soft Wu decoding are based on converting the above conventional algorithms for interpolation in KV decoding. In the literature, each interpolation algorithm for KV decoding is converted to an algorithm for hard/soft Wu decoding separately "by hand."

For example, in Trifonov and Lee, the algorithm for interpolation for Guruswami-Sudan hard list decoding is carefully modified to apply to hard Wu decoding. This algorithm supports hard Wu decoding (all multiplicities $m_x$ equal to the same single number m), as well as restricted soft Wu decoding (all multiplicities $m_x$ are either 0 or a single number m), but not some general soft Wu decoding, where the entries $m_x$ of the vector of multiplicities may take arbitrary non-negative integer values.

In P. Beelen, et al., an explicit basis is found for a homogenized version of the module $\overline{N}$, and then efficient conventional algorithms of version 2 are used. The basis in Beelen et al. is suitable for the hard Wu algorithm, but not for the soft Wu algorithm (a single multiplicity is assumed).

The methods shown in FIGS. 4A-4C provide a flexible and general method for converting an algorithm for conventional interpolation to an algorithm for interpolation in soft Wu decoding.

Referring to FIG. 4A, FIG. 4A illustrates a refinement algorithm, which may use any conventional interpolation algorithm for finding a Groebner basis for the sub-module $N_A$ and then, using Koetter's algorithm, refines the obtained Groebner basis to obtain the required Groebner basis for the module $\overline{N}$.

If the number of points of type B were large, then using Koetter's algorithm could be an efficient solution by choosing the initial values of the variables to automatically account for points of type B, and then running the main loop of the algorithm only for points of type A. In detail, using Lemma 4 of R. Koetter, J. Ma and A. Vardy, "The re-encoding transformation in algebraic list-deciding of Reed-Solomon codes," IEEE Trans. Inform. Theory, vol. 57, no. 2, pp. 633-647, February 2011, the entire contents of which are hereby incorporated by reference, and recalling that the multiplicity constraints for points of type B are on the Y-reversed version of the bivariate polynomial, the initialization in Koetter's algorithm as presented in McEliece, may be replaced by the following for loop:

$$\text{for } j=0 \text{ to } l, g_j = Y^j \cdot \Pi_{x \in B}(X-x)^{[m_x-(l-j)]_+}.$$

Here, for a number t, $t_+$ is defined by $$t_+ := \begin{cases} t & \text{if } t \geq 0 \\ 0 & \text{if } t < 0 \end{cases}.$$

However, the number of points of type B is generally small.

At S410, the decoder determines an (l+1)-element Groebner basis for $N_A$ using any conventional algorithm.

For example, the decoder may use Koetter's algorithm, or the algorithm of Lee and O'Sullivan, as described in K. Lee and M. E. O'Sullivan, "List decoding of Reed-Solomon codes from a Groebner basis perspective," Journal of Symbolic Computation, 43 (2008), pp. 645-658, and in K. Lee and M. E. O'Sullivan, "An interpolation algorithm using Groebner bases for soft-decision decoding of Reed-Solomon codes," in Proc. ISIT 2006, the entire contents of each of which are hereby incorporated by reference.

At S420, the decoder applies C iterations of Koetter's algorithm to convert the Groebner basis for the sub-module $N_A$ to a Groebner basis for the module $\bar{N}$, where $$C := \sum_{x^{-1} \in B} \frac{m_x(m_x+1)}{2}$$

Koetter's algorithm is an iterative algorithm. The requirement of having a minimum prescribed multiplicity at each point is described as a list of homogenous K-linear equations in the coefficients of the bivariate polynomial. These equations are ordered such that cumulative kernels are K[X]-modules.

Here, a j-th cumulative kernel is a K-sub-vector-space of $\{\Sigma_i^j F_i(X)Y^i\}$ consisting of all the polynomials whose coefficients satisfy the first j homogeneous linear equations. The term "cumulative kernel" refers to the j-th cumulative kernel for some j.

For Koetter's algorithm to work, the homogeneous linear equations should be ordered such that the cumulative kernels are not just K-vector spaces, but also K[X]-modules. It should be noted that not any set of homogenous linear equations may be ordered such that the cumulative kernels form K[X]-modules. However, for the linear equations corresponding to the constraints defining $N_A$, such an ordering may be found. Moreover, following from Wu using Koetter's algorithm, the linear equations corresponding to the set of constraints defining $\bar{N} = N_A \cap N_B$ may be ordered such that the cumulative kernels form K[X]-modules.

As opposed to the method in FIG. 4A, Wu suggested to use Koetter's algorithm for the entire interpolation problem in hard/soft Wu decoding, that is, to find a Groebner basis for N. On the other hand, the decoder uses an algorithm that is more efficient than Koetter's algorithm (e.g., the algorithm of Giorgi et al.) at S410, and only a part of the work (taking points of type B into account) is performed with Koetter's algorithm at S420.

In each iteration of Koetter's algorithm, the decoder assumes there is an (l+1)-element Groebner basis for a so-far cumulative kernel, with the following "diagonal property:" the leading monomials of the elements of the basis contain distinct standard unit vectors.

Each one of the C iterations performed by the decoder, at S420, then converts the exiting Groebner basis for the current cumulative kernel (which is the intersection of $N_A$ and the cumulative kernel corresponding only to the so-far considered homogeneous equations corresponding to points of type B) to a Groebner basis with the diagonal property for the next cumulative kernel.

The requirement on points of type B can also be broken to homogenous linear equations by the decoder, and these equations can be arranged by the decoder so that the cumulative kernels are K[X]-modules. Note that this also implies that the intersections of the cumulative kernels corresponding only to the points of type B with $N_A$ are K[X]-modules (since the intersection of modules is a module).

The refinement algorithm works because any (l+1)-element Groebner basis of a rank-(l+1) sub-module of $K[X]^{l+1}$ must have the diagonal property. Otherwise, there are two basis elements whose leading monomials contain the same unit vector. In this case, one leading monomial must divide the other, and hence one basis vector can be discarded while keeping the remaining set a Groebner basis (in particular, a set of generators). As a result, a set of generators whose cardinality is smaller than the rank is obtained, which is a contradiction.

In the method of FIG. 4A, the decoder uses the Groebner basis for the sub-module $N_A$, potentially obtained from an algorithm that is more efficient than Koetter's algorithm, as if it were the output of previous iterations of Koetter's algorithm, and continues to handle points of type B.

EXAMPLE

Consider a binary BCH code of length $2^{13}-1$ and with a correction radius of t=70 (this code may be used in practice in some NAND flash applications).

As described above, the number of points of type B is determined by the outputs of the hard-decision decoding at S3200 and the multiplicity assignment at S3275.

A simulation in which the number of HD errors was drawn uniformly in [71,140] was run. The histogram of points of type B was as follows:

| | num. of points of type B | | | |
|---|---|---|---|---|
| | 0 | 1 | 2 | 3 |
| num. of experiments (out of 100) | 58 | 34 | 7 | 1 |

Therefore, the probability of having more than 3 points of type B is small (e.g., 1 out of 100). In one simulated soft-decision example, the required multiplicities for the above code were as follows:

| | multiplicity | | | | | | |
|---|---|---|---|---|---|---|---|
| | 6 | 5 | 4 | 3 | 2 | 1 | 0 |
| number of points | 9 | 15 | 12 | 18 | 30 | 62 | 8191-146 |

Assuming that out of these points, there are 3 points of type B and the required multiplicities at these points are 5, 3, and 2. Then, the total cost of the points of type A is 770, and the total cost of points of type B is 24.

The extra cost for refinement is the complexity of the 24 last iterations of Koetter's algorithm. This is more than 24/794 of the total complexity of running Koetter's algorithm. Approximating the complexity of iteration i of Koetter's algorithm as i units of complexity, the complexity of refinement is $$\frac{794 \cdot 795 - 770 \cdot 771}{794 \cdot 795} \approx 0.06$$

of the complexity of solving the entire problem with Koetter's algorithm.

If the conventional interpolation algorithm for points of type A is 5 times faster than the complexity of Koetter's algorithm for a full solution, then after using the refinement, the overall complexity will be about $$0.2 + 0.06 = 0.26$$

of that of Koetter's algorithm (4 times faster).

FIG. 4B illustrates a triangular basis algorithm, which starts with any algorithm for finding a triangular basis for the sub-module $N_A$ (e.g., the Lee and O'Sullivan algorithm of Lee, et al., "An interpolation algorithm using Groebner bases for soft-decision decoding of Reed-Solomon codes," Proc. ISIT 2006), corrects the obtained triangular basis so that it becomes a triangular basis for the module $\overline{N}$, and applies a conventional interpolation algorithm of version 2 (e.g., the algorithm of Giorgi et al. or the algorithm of Lee and O'Sullivan) to obtain the Groebner basis for the sub-module $\overline{N}$.

At S430, the decoder applies a known algorithm to determine a triangular basis $\{g_0, \ldots, g_l\}$ for the sub-module $N_A$. For example, the decoder may use the algorithm of Lee and O'Sullivan, 2006, to find the triangular basis for the sub-module $N_A$.

At S440, the decoder modifies the triangular basis $\{g_0, \ldots, g_l\}$ for the sub-module $N_A$ such that it takes into account the points of type B. As a result, the modified triangular basis is a triangular basis for the module $\overline{N}$.

More specifically, if $g_0 = g_{00}(X)$, $g_1(X, Y) = g_{10}(X) + g_{11}(X)Y, \ldots, g_l(X, Y) = g_{l,0}(X) + \ldots + g_{l,l}(X)Y^l \in K[X, Y]$ form a basis for $N_A$, then for $$f_j(X) := \prod_{x \in B} (X - x)^{[m_x - 1 - (\ell - j)]_+}, \quad j = 0, \ldots, \ell,$$

if $\gcd(g_{jj}(X), f_j(X)) = 1$ for all j, then the following is a triangular basis for the module $\overline{N}$:

$$\{f_0 g_0, \ldots, f_l g_l\}$$

The justification for the above triangular basis for N follows from the following two lemmas. The first lemma is an immediate consequence of Lemma 4 of Koetter-Ma-Vardy (R. Koetter, J. Ma, and A. Vardy, "The re-encoding transformation in algebraic list-decoding of Reed-Solomon codes," IEEE Trans. Inform. Theory, vol. 59, no. 6, pp. 3269-3281, June 2013, the entire contents of which are incorporated by reference), noting that the polynomials in $N_B$ are just the Y-reversed version of those considered in that lemma.

Lemma 1

$N_B$ is the set of all polynomials $a_l(X)Y^l + a_{l-1}(X)Y^{l-1} + \ldots + a_0(X)$ for which $$f_j(X) := \prod_{x \in B} (X - x)^{[m_x - 1 - (\ell - j)]_+}$$

divides $a_j(X)$ for all $j \in \{1, l-1, \ldots, 0\}$.

Note the following:
1. The polynomials $f_j(X)$ from Lemma 1 satisfy $f_0(X) | f_1(X) | \ldots | f_l(X)$.
2. For the triangular basis $g_0 = g_{00}(X)$, $g_1(X, Y) = g_{10}(X) + g_{11}(X)Y, \ldots, g_l(X, Y) = g_{l,0}(X) + \ldots + g_{l,l}(X)Y^l$ obtained from the algorithm of Lee and O'Sullivan, 2006, upon letting a multiplicity matrix M of Lee and O'Sullivan, 2006 be the vector of multiplicities for points of type A, $\{m_{x-1}\}_{x \in A}$, satisfies $\gcd(g_{jj}(X), f_j(X)) = 1$. This follows from the definition of the $g_j(X, Y)$ in Equation (2) of Lee and O'Sullivan, 2006, which shows that $g_{jj}(X)$ may include only linear factors of the form $X-x$ for $x \in A$, but not for $x \in B$.

These two facts show that Lemma 2 may be used.

Lemma 2

Suppose that $t_0(X), t_1(X), \ldots, t_l(X) \in K[X]$ satisfy $t_0(X) | t_1(X) | \ldots | t_l(X)$. Let $$M := \{h_0(X) + h_1(X)Y + \ldots + h_l(X)Y^l | \forall j, t_j(X) | h_j(X)\},$$

$g_0 = g_{00}(X)$, $g_1(X, Y) = g_{10}(X) + g_{11}(X)Y, \ldots, g_l(X, Y) = g_{l,0}(X) + \ldots + g_{l,l}(X)Y^l$ be polynomials with $g_{jj} \neq 0$ and $\gcd(g_{jj}, t_j) = 1$ for all j.

Then $\langle g_0, g_1, \ldots, g_l \rangle \cap M = \langle t_0 g_0, t_1 g_1, \ldots t_l g_l \rangle$, where for an integer k and for polynomials $a_1(X, Y), \ldots, a_k(X, Y) \in K[X, Y]$, $\langle a_1, \ldots, a_k \rangle$ stands for the sub-K[X]-module of K[X, Y] generated by $a_1, \ldots, a_k$.

Proof of Lemma 2

$\supseteq$: The coefficient of $Y^i$ in a K[X]-linear combination of the $t_j g_j$ is in the ideal generated by $\{t_i, t_{i+1}, \ldots, t_l\}$, that is, in the ideal generated by $t_i$. $\subseteq$: Take some $h(X, Y)$ in the intersection, and let $i \in \{0, \ldots, l\}$ be the Y-degree of h. Because the $g_j$ form a rectangular basis with non-zero elements on the main diagonal, there exist $a_0(X), \ldots, a_i(X)$ such that $h = \Sigma_{j=0}^{i} a_j(X) g_j(X, Y)$. To complete the proof, it is sufficient to show that $t_j | a_j$ for all $j \in \{0, \ldots, i\}$. Write $h = \Sigma_{j=0}^{i} h_j(X) Y^j$. First, since $h_i = a_i g_{ii}$, $t_i | h_i$, and $\gcd(g_{ii}, t_i) = 1$, it must hold that $t_i | a_i$. Suppose by induction that $t_j | a_j$ for all $j = i, i-1, \ldots, k+1$ for some k. Now, $h_k(X) = \Sigma_{j=k}^{i} a_j(X) g_{jk}(X) = a_k(X) g_{kk}(X) + t_{k+1}(X) u(X)$ for some $u(X)$ (where the equality follows from the induction hypothesis and from $t_{k+1}(X) | t_{k+2}(X) | \ldots | t_l(X)$). Hence $a_k(X) g_{kk}(X) = h_k(X) - t_{k+1}(X) u(X)$ is divisible by $t_k(X)$, because both $h_k(X)$ and $t_{k+1}(X)$ are. Since $\gcd(g_{kk}, t_k) = 1$, $t_k | a_k$, as required.

At S450, the decoder converts the triangular basis for the module N to a Groebner basis for the module N using any conventional algorithm of version 2 (e.g., the algorithm of Giorgi et al.). The triangular-basis conversion at S440 increases a maximum degree of an element of the matrix whose rows are the basis elements by at most $\Sigma_{x \in B} m_{x-1}$. The maximum degree appears as a linear factor in the asymptotic complexity analysis of some algorithms (e.g., the algorithm of Giorgi et al.).

FIG. 4C illustrates an example embodiment of determining a Groebner basis for the module $\overline{N}$ using either the method of FIG. 4A or the method of FIG. 4B.

At S460, the decoder determines if a total cost of points of type B is above some threshold. If the total cost of points of type B is above the threshold, then the decoder performs the method of FIG. 4B at S480. As an alternative, the decoder may perform Koetter's algorithm at S480, with the points of type B handled in the initialization described above.

If the total cost of points of type B is at or below the threshold, then the decoder performs the method of FIG. 4A at S470.

Referring back to FIG. 3, the decoder performs factorization at S3400, after preforming the interpolation. The decoder finds all linear factors of the form Y−f̃(X) of Q(X, Y) where f̃(X) is a formal power series in X. Because f̃(X) is a formal power series, it will typically have an infinite number of non-zero coefficients.

For decoding, the decoder obtains, for each linear factor Y−f̃(X), a truncated version, consisting of the first coefficients (a description on the number of used coefficients appears below), which will be referred to by f(X).

Factorization can be done with the well-known Roth-Ruckenstein algorithm, as described in Section III.C of Wu's paper. If the hard-decision decoding works as in Beelen et al., then in some cases, factorization is performed by the decoder for both Q(X, Y) and the Y-reversed version of Q(X, Y).

If the hard-decision decoding works as in Wu's paper, that is, if the outputs $\Lambda(X)$ and $B_+(X)$ are taken as $\Lambda(X)$ and $XB(X)$ or $X^2B(X)$ from the Berlekamp-Massey or the Berlekamp algorithm as explained above, then factorization is performed by the decoder for Q(X, Y).

At S3500, the decoder performs error-locator construction. The purpose of the error-locator construction is to restore an error-locator polynomial $\tilde{\Lambda}(X)$ from the available data $\Lambda(X)$, $B_+(X)$ and f(X), for each linear factor as above. The way that this is done by the decoder depends on the method used in the hard-decision decoding at S3200, but all methods begin by finding polynomials $f_1(X)$ and $f_2(X)$ such that $$\tilde{f}(X) = \frac{f_1(X)}{f_2(X)}.$$

One way the decoder may construct the polynomials $f_1(X)$ and $f_2(X)$ from f(X) is to use an algorithm such as the Berlekamp-Massey algorithm, as explained in Section III.C of Wu's paper. An alternative method is to use the Euclidean algorithm, as described on page 3274 of Beelen et al. For both methods, the number of required coefficients from the power series (that is, how much of the series f̃ should be recovered in the truncated series f) depends on lower bounds of the degrees of $f_1(X)$ and $f_2(X)$. The required number of coefficients appears, for example, in Sections III.C and IV of Wu's paper (for Reed-Solomon and binary BCH codes, respectively). The two polynomials $f_1(X)$ and $f_2(X)$ are then used with the outputs $\Lambda(X)$, $B_+(X)$ of the hard-decision decoding to reconstruct either the estimated error-locator polynomial itself, or the even part of the error-locator polynomial (e.g., Beelen et al.), as explained in Sections III and IV of Wu's paper (for Reed-Solomon and binary BCH codes, respectively), and in Algorithms 1 and 2 of Beelen et al. (for Reed-Solomon and binary Goppa codes).

In the second case, when only an even part was estimated, the decoder performs some additional processing to get the error-locator polynomial. For example, the above-mentioned modified key equation may be used by the decoder to calculate the odd part of the error-locator polynomial from the available even part. Once both the odd and even parts are known, they may be put together by the decoder to form the error-locator polynomial. Alternatively, the method of Step 6 of Algorithm 2 of Beelen et al. may be used, which avoids the intermediate step of constructing the even part of the error locator, and constructs the estimated error-locator directly from $f_1(X)$ and $f_2(X)$ and the outputs of the hard-decision decoding at S3200.

Because there may be up to f distinct linear factors of the form Y−f̃(x) to Q(X, Y), the output of this stage of the decoder might include more than one potential error locator, that is, a whole list of up to l error locators.

At S3600, the decoder determines the error locators by finding the roots of the error-locator polynomial (Chien search), for each error locator polynomial in the list. In case the decoded code is non-binary, the decoder also determines the error-evaluator polynomial (e.g., by substituting the known error-locator in the key equation) and the error values, using conventional methods, for each error-locator polynomial in the list. Since both error values and locations are known to the decoder at this stage, the decoder proceeds to correct the errors.

It should be noted that using conventional methods, some of the obtained estimated error-locator polynomials in the list may be immediately discarded, even without a Chien search. For example, if an estimated error-locator polynomial has a degree of t or less, then it can be discarded, for if the number of errors had been t or less, then the hard-decision decoding would not have failed in the first place.

In general, a different corrected word is obtained for each valid error-locator polynomial in the list, where "valid" means that the degree is above t, and that the syndrome of the corrected word is zero. At the final stage of decoding, the decoder decides on a single word from the obtained list of words. This may be done using conventional methods, such as picking the most likely word, or the approximately most likely word (e.g., the word closest in Hamming distance to the hard-decision word).

Figure 5:
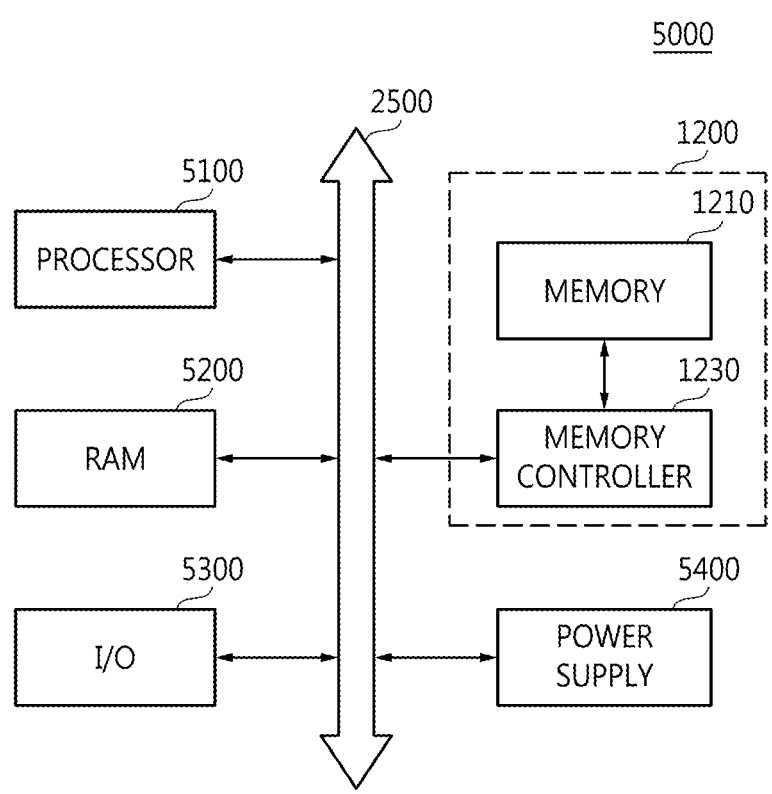
FIG. 5 is a block diagram of an electronic apparatus adopting a memory system according to an example embodiment.

FIG. 5 is a block diagram of an electronic apparatus adopting a memory system according to an example embodiment of inventive concepts.

Referring to FIG. 5, an electronic apparatus 5000 includes a processor 5100, a read-only-memory (RAM) 5200, an input/output device 5300, a power supply device 5400, and the storage device 1200. Although not shown in FIG. 5, the electronic apparatus 5000 may further include ports that may communicate with video cards, sound cards, or universal serial bus (USB) devices, or other electronic devices. The electronic device 5000 may be realized as a personal computer, or a portable electronic device such as a notebook computer, a mobile phone, a personal digital assistant (PDA), and a camera.

The processor 5100 may perform certain calculations or tasks. Accordingly, the processor 5100 may be a microprocessor or a central processing unit (CPU). The processor 5100 may communicate with the RAM 5200, the input/output device 5300, and the storage device 1200 via a bus 5500 such as an address bus, a control bus, and a data bus. In some embodiments, the processor 5100 may be connected to an expanded bus such as peripheral component interconnect (PCI) bus.

The RAM 5200 may store data that is used to operate the electronic apparatus 5000. For example, the RAM 5200 may be a dynamic RAM (DRAM), a mobile DRAM, an SRAM, a PRAM, an FRAM, an RRAM, and/or an MRAM.

The input/output device 5300 may include an input unit such as a keyboard, a keypad, or a mouse, and an output unit such as a printer or a display. The power supply device 5400 may supply an operating voltage to operate the electronic apparatus 5000.

Figure 6:
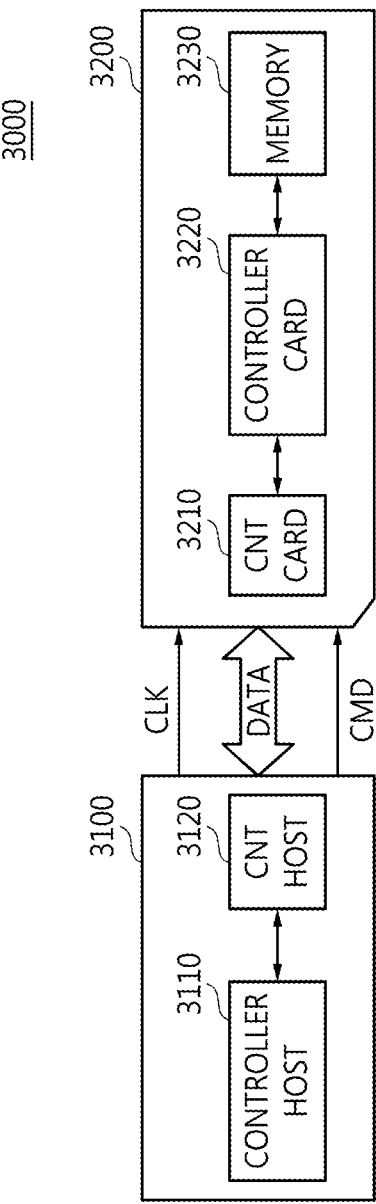
FIG. 6 is a block diagram of a memory card system according to an example embodiment.

FIG. 6 is a block diagram of a memory card system including a memory system 3000 according to an example embodiment of inventive concepts.

Referring to FIG. 6, the memory card system 3000 may include a host 3100 and a memory card 3200. The host 3100 includes a host controller 3110, and a host connecting unit 3120. The memory card 3200 may include a card connecting unit 3210, a card controller 3220, and a memory device 3230.

The card controller 3220 and the memory device 3230 shown in FIG. 6 may be the device controller 1230 and the memory device 1210, shown in FIG. 1.

The host 3100 may write data to the memory card 3200, or may read data stored in the memory card 3200. The host controller 3110 may transmit commands CMD, clock signals CLK generated in a clock generator (not shown), and data DATA to the memory card 3200 via the host connecting unit 3120.

The memory card 3200 may be a compact flash card (CFC), a microdrive, a smart media card (SMC), a multimedia card (MMC), a security digital card (SDC), a memory stick, or a US flash memory driver.

Figure 7:
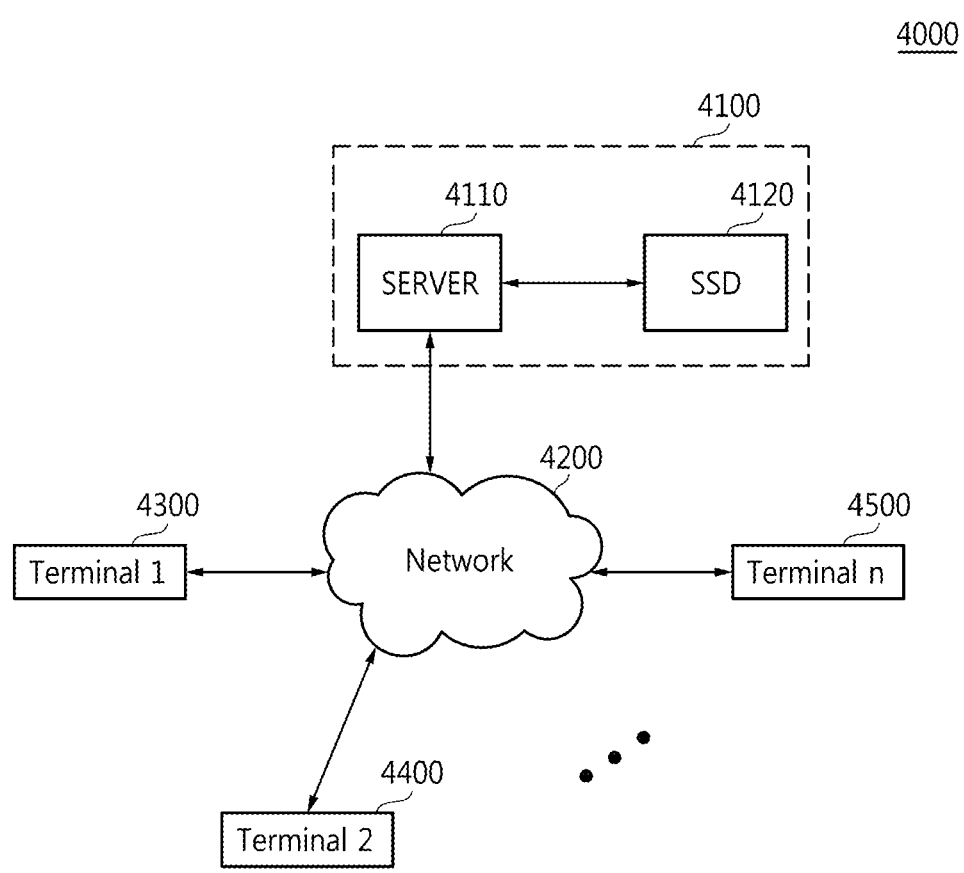
FIG. 7 is a block diagram showing an example of network configuration according to an example embodiment.

FIG. 7 is a block diagram showing an example of network configuration about a server system 4100 including an SSD according to an example embodiment of inventive concepts.

Referring to FIG. 7, the network system 4000 may include a server system 4100, and a plurality of terminals 4300, 4400, and 4500 connected to each other via a network 4200. The server system 4100 of the present embodiment may include a server 4110 processing requests transmitted from the plurality of terminals 4300, 4400, and 4500 connected to the network 4200, and an SSD 4120 storing data corresponding to the requests transmitted from the terminals 4300, 4400, and 4500. Here, the SSD 4120 may be the storage device 1200, shown in FIG. 1.

Meanwhile, the memory system according to inventive concepts may be mounted by using various types of packages. For example, the memory system according to inventive concepts may be mounted by using packages such as a package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

Figure 8:
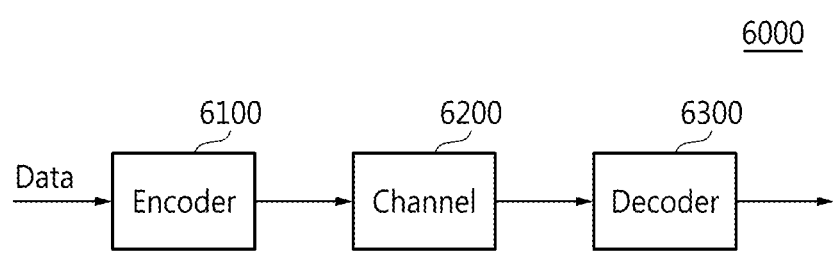
FIG. 8 is a block diagram showing a coding system according to an example embodiment.

FIG. 8 illustrates a coding system according to an example embodiment. A coding system 6000 may be implemented in wireless communications, wired (cable-based) communications, satellite communications and storage devices (volatile and non-volatile).

As shown, an encoder 6100 encodes data to generate coded data. The encoder 6100 sends the coded data through a channel 6200 to a decoder 6300. The channel 6200 may be associated with a medium such as radio, wired and/or satellite depending on a type of coding system.

The decoder 6300 decodes the coded word to generate decoded data. The decoder 6300 may decode the coded word using the interpolation described above with reference to FIG. 3. Moreover, the overall decoding of the decoder 6300 may be the same and/or similar the method shown in FIG. 3 based on the type of coding system.

For example, if the coding system 6000 is a communication system, a measured voltage at the receiver input is already soft information (a quantized real number). In this case, the receiver performs "per-coordinate hard decisions," that is, it converts each received number to one or more bits.

The foregoing description of example embodiments has been provided for purposes of illustration and description. It is not intended to be exhaustive or limiting. Individual elements or features of a particular example embodiment are generally not limited to that particular example embodiment. Rather, where applicable, individual elements or features are interchangeable and may be used in a selected embodiment, even if not specifically shown or described. The same may also be varied in many ways. All such modifications are intended to be included within the scope of this disclosure.

What is claimed is:

1. A method of soft-decision Wu decoding a code, the code being one of a generalized Reed-Solomon type and an alternant type, the method comprising:
   obtaining the code, the code having at least one property defining at least one module, the module being a sub-module of at least a first extension module and a second extension module, the first extension module being defined by a set of first type constraints and the second extension module being defined by a set of second type constraints;
   determining a triangular basis for the first extension module; and
   determining a basis for the module based on the triangular basis for the first extension module, wherein the determining a basis for the module includes,
      determining a triangular basis for the module based on the triangular basis for the first extension module, and
      converting the triangular basis for the module to a Groebner basis for the module.

2. The method of claim 1, wherein the triangular basis for the module is $\{f_0 g_0, \ldots, f_l g_l\}$ wherein $\{g_0, \ldots, g_l\}$ is the triangular basis for the first extension module and $$f_j(X) := \prod_{x \in B} (X - x)^{[m_x - 1 - (\ell - j)]_+}, j = 0, \ldots, \ell,$$

where B indicates the second type constraints, l is a list size and $m_x$ are entries of a vector of multiplicities.

3. The method of claim 1, wherein the code is a binary BCH code.

4. The method of claim 1, wherein the code is a Reed-Solomon code.

5. The method of claim 1, wherein the obtaining obtains the code from a three-dimensional memory array.

6. The method of claim 5, wherein the three-dimensional memory array comprises a plurality of memory cells, each of the memory cells including a charge trap layer.

7. The method of claim 5, wherein at least one of word lines and bit lines in the three-dimensional memory array are shared between levels.

* * * * *